United States Patent
Song (10) Patent No.: US 9,478,656 B2
(45) Date of Patent: Oct. 25, 2016

(54) METHOD FOR FABRICATING A FIELD EFFECT TRANSISTOR WITH LOCAL ISOLATIONS ON RAISED SOURCE/DRAIN TRENCH SIDEWALLS

(71) Applicant: Semiconductor Manufacturing International (Shanghai) Corporation, Shanghai (CN)

(72) Inventor: Hualong Song, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/554,168

(22) Filed: Nov. 26, 2014

(65) Prior Publication Data
US 2015/0155381 A1 Jun. 4, 2015

(30) Foreign Application Priority Data
Dec. 4, 2013 (CN) .......................... 2013 1 0646204

(51) Int. Cl.
*H01L 21/762* (2006.01)
*H01L 29/06* (2006.01)
(Continued)

(52) U.S. Cl.
CPC ....... *H01L 29/7834* (2013.01); *H01L 21/0262* (2013.01); *H01L 21/02532* (2013.01); *H01L 21/02634* (2013.01); *H01L 21/02636* (2013.01); *H01L 21/3065* (2013.01);
(Continued)

(58) Field of Classification Search
CPC ................... H01L 21/02532; H01L 21/0262; H01L 21/02634; H01L 21/02636; H01L 21/3065; H01L 21/31116; H01L 21/336; H01L 21/425; H01L 21/76224; H01L 29/7834; H01L 29/0653; H01L 29/66492; H01L 29/6653; H01L 29/6656; H01L 29/66636; H01L 29/165; H01L 29/0649; H01L 29/66537; H01L 29/66606; H01L 29/66575; H01L 29/6659; H01L 29/7843; H01L 29/7848; H01L 29/94; H01L 29/772; H01L 29/78; H01L 29/76
USPC ......... 257/288, 336; 438/300, 302, 305, 190
See application file for complete search history.

(56) References Cited

U.S. PATENT DOCUMENTS 6,071,783 A * 6/2000 Liang .................. H01L 29/0653
257/E21.431
6,399,973 B1 * 6/2002 Roberds ............ H01L 21/76264
257/288

(Continued)

*Primary Examiner* — Marc Armand
*Assistant Examiner* — Younes Boulghassoul
(74) *Attorney, Agent, or Firm* — Anova Law Group, PLLC (57) ABSTRACT

A method is provided for fabricating a semiconductor device. The method includes providing a semiconductor substrate having a gate structure; and forming offset sidewall spacers around the gate structure. The method also includes forming trenches in the semiconductor substrate at outside of the gate structure; and forming isolation layers on side surfaces of the trenches to prevent diffusions between subsequently formed doping regions. Further, the method includes removing at least portions of the offset sidewall spacers to expose portions of the surface of the semiconductor substrate between the gate structure and the trenches; and forming filling layers with a top surface higher than the surface of the semiconductor substrate by filling the trenches and covering portions of the surface of the semiconductor substrate between the trenches and the gate structure. Further, the method also includes forming doping regions configured as raised source/drain regions in the filling layers.

18 Claims, 6 Drawing Sheets

(51) Int. Cl.
*H01L 29/78* (2006.01)
*H01L 29/66* (2006.01)
*H01L 21/3065* (2006.01)
*H01L 21/02* (2006.01)
*H01L 21/311* (2006.01)
*H01L 29/165* (2006.01)

(52) U.S. Cl.
CPC .. *H01L 21/31116* (2013.01); *H01L 21/76224* (2013.01); *H01L 29/0653* (2013.01); *H01L 29/6653* (2013.01); *H01L 29/6656* (2013.01); *H01L 29/6659* (2013.01); *H01L 29/66492* (2013.01); *H01L 29/66636* (2013.01); *H01L 29/7848* (2013.01); *H01L 29/165* (2013.01)

(56) References Cited

U.S. PATENT DOCUMENTS

| | | | | |
|---|---|---|---|---|
| 6,483,158 B1* | 11/2002 | Lee | H01L 29/0653 | 257/344 |
| 7,399,663 B2* | 7/2008 | Hoentschel | H01L 21/84 | 257/E21.428 |
| 7,517,775 B2* | 4/2009 | Kim | H01L 21/0237 | 117/84 |
| 7,528,453 B2* | 5/2009 | Holz | H01L 29/0653 | 257/374 |
| 7,928,474 B2* | 4/2011 | Lin | H01L 29/66553 | 257/190 |
| 8,361,847 B2* | 1/2013 | Johnson | H01L 29/0847 | 257/E21.41 |
| 2003/0234422 A1* | 12/2003 | Wang | H01L 29/0649 | 257/336 |
| 2005/0153538 A1* | 7/2005 | Tsai | H01L 21/31116 | 438/636 |
| 2006/0157793 A1* | 7/2006 | Shima | H01L 29/1083 | 257/368 |
| 2007/0012994 A1* | 1/2007 | Chou | H01L 29/0653 | 257/327 |
| 2012/0091469 A1* | 4/2012 | Park | H01L 29/0847 | 257/77 |
| 2012/0286336 A1* | 11/2012 | Zhao | H01L 29/66636 | 257/288 |
| 2013/0032859 A1* | 2/2013 | Pei | H01L 29/6656 | 257/192 |

* cited by examiner

METHOD FOR FABRICATING A FIELD EFFECT TRANSISTOR WITH LOCAL ISOLATIONS ON RAISED SOURCE/DRAIN TRENCH SIDEWALLS

CROSS-REFERENCES TO RELATED APPLICATIONS

This application claims the priority of Chinese patent application No. 201310646204.8, filed on Dec. 4, 2013, the entirety of which is incorporated herein by reference.

FIELD OF THE INVENTION

The present invention generally relates to the field of semiconductor manufacturing technology and, more particularly, relates to semiconductor devices and fabrication techniques thereof.

BACKGROUND

With the rapid development of the ultra-large-scale integration (ULSI), the manufacturing process of integrated circuits (ICs) has become more and more complex, and more and more precise. In order to improve the integration level and lower the production cost, the critical dimension (CD) of semiconductor devices has become smaller and smaller; while the quantity of the semiconductor devices in a unit area has been continuously increased. When continuously decreasing the critical dimension of the semiconductor devices, the geometries of the semiconductor devices have also been changed.

For a semiconductor device, when the channel length is shrunk to a scale comparable to the total width of the depletion regions at both sides of the gate structure, for example, the channel length may be in proximity to the total width of the depletion regions, some phenomena which are significantly different from the phenomena that happen to a semiconductor device having a relatively long channel region may occur. Under this circumstance, the performance of the semiconductor device is significantly affected; and the effects caused by reducing the channel length are referred as short channel effects (SCEs).

The SCEs increase the drive current of the semiconductor devices, but the offset current, i.e., an absolute value of the difference between input currents of the semiconductor devices, may deteriorate the performance of the semiconductor devices. For example, a source to drain punch may happen. Further, the function of the semiconductor devices may also become more and more complex. The disclosed device structures and methods are directed to solve one or more problems set forth above and other problems.

BRIEF SUMMARY OF THE DISCLOSURE

One aspect of the present disclosure includes a method for fabricating a semiconductor device. The method includes providing a semiconductor substrate; and forming a gate structure on the semiconductor substrate. The method also includes forming offset sidewall spacers covering side surfaces of the gate structure and exposing a surface of the semiconductor substrate on the surface of the semiconductor substrate; and forming trenches in the semiconductor substrate at outside of the gate structure by etching the semiconductor substrate using the offset sidewall spacers as an etching mask. Further, the method includes forming isolation layers on side surfaces of the trenches to prevent diffusions between subsequently formed doping regions; and removing at least portions of the offset sidewall spacers to expose portions of the surface of the semiconductor substrate between the gate structure and the trenches. Further, the method also includes forming filling layers with a top surface higher than the surface of the semiconductor substrate by filling the trenches and covering the portions of the surface of the semiconductor substrate between the trenches and the gate structure; and forming doping regions in the filling layers to form raised source/drain regions.

Another aspect of the present disclosure includes a semiconductor device. The semiconductor device includes a semiconductor substrate; and a gate structure formed on a surface of the semiconductor substrate. The semiconductor device also includes filling layers formed in the semiconductor substrate at both sides of the gate structure and on portions of the surface of the semiconductor substrate between the gate structure and side surfaces of the filling layers; and doping regions formed in the filling layers. Further, the semiconductor device includes isolation layers formed between side surfaces of the filling layers and the semiconductor substrate to prevent diffusions between the doping regions.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
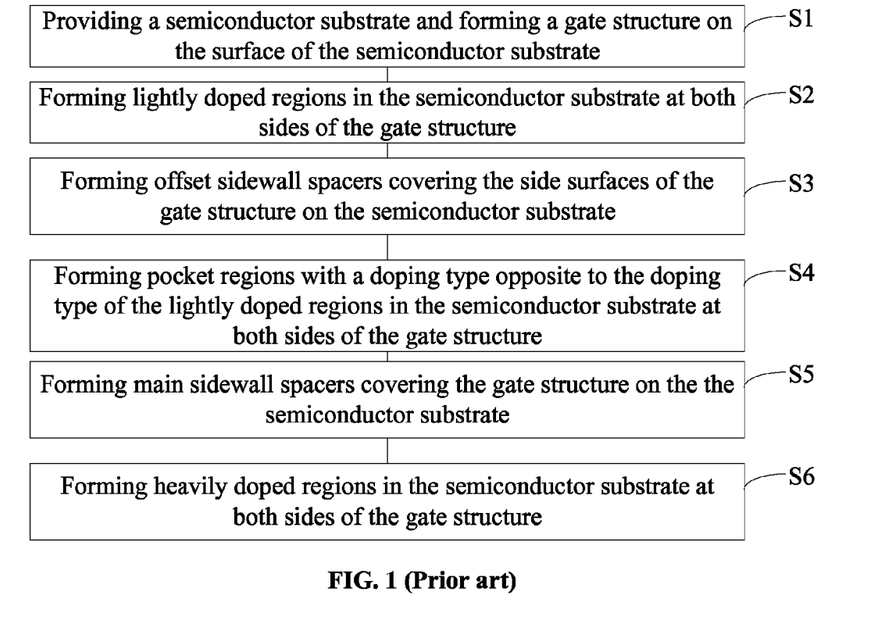
FIG. 1 illustrates an existing fabrication process of a semiconductor device.

FIG. 1 illustrates an existing fabrication process of a semiconductor device.

As shown in FIG. 1, the fabrication process includes, sequentially, providing a semiconductor substrate (S1); and forming a gate structure on the surface of the semiconductor substrate (S2). The method also includes forming lightly doped regions in the semiconductor substrate at both sides of the gate structure (S3); and forming offset sidewall spacers on the surface of the semiconductor substrate at both sides of the gate structure (S4). Further, the method includes forming pocket regions in the semiconductor substrate at both sides of the gate structure by an ion implantation process using the offset sidewall spacers as a mask (S5). The doping type of the pocket regions is opposite to the doping type of the lightly doped regions. Further, the method also includes forming main sidewall spacers on the surface of the semiconductor substrate at both sides of the offset sidewall spacers; and forming heavily doped regions in the semiconductor substrate at both sides of the main sidewall spacers (S6).

When the size of the semiconductor device formed by the above-mentioned process is continuously shrunk, the semiconductor device may have a short channel effect. In order to prevent the short channel effect, the channel length of the semiconductor device may need to be greater than a certain length $L_{min}$. The certain length $L_{min}$ may be described as $L_{min}=A[x_j d_{ox}(W_s+W_d)^2]^{1/3}$. Wherein $L_{min}$ may refer to a minimum channel length of the semiconductor device for obtaining the sub-threshold characteristics of the channel region; $x_j$ may refer to a junction depth of the depletion layers of the heavily doped regions; $W_d$ and $W_s$ may refer to the widths of the depletion layers of the heavily doped regions at both sides of the gate structure, respectively; and $d_{ox}$ may refer to the thickness of the gate oxide layer. Thus, in order to obtain a semiconductor device with a relatively short channel length, it may need to reduce the thickness of the gate oxide layer, the width of the depletion layers of the heavily doped regions and the junction depth.

However, the thickness of the gate oxide layer may have reached its limitation. For example, when the thickness of the gate oxide layer is approximately 40 Å, a tunneling current may be generated; and the tunneling current may penetrate through the gate oxide layer to flow from the gate structure to the semiconductor substrate, thus the semiconductor device may fail.

Further, the width of the depletion layers of the heavily doped regions may be inversely promotional to the doping concentration of the semiconductor substrate. Although increasing the doping concentration of the semiconductor substrate may decrease the width of the depletion layers, however, the junction capacitance and the threshold voltage may also be increased simultaneously. Therefore, the width of the depletion layers may not be continuously decreased.

Therefore, it may be an effective way to prevent the short channel effect by reducing the junction depth of the heavily doped regions. The junction depth of the heavily doped regions may be dependent of an ion implantation process or a diffusion process for forming the heavily doped regions. Because of the limitation of the ion implantation process and the short channel effect, it may be difficult to form a relatively shallow junction, such as a depth of 500 Å, etc. Generally, a pre-amorphous process may significantly lower the short channel effect of the ion implantation process, however, defects caused by the ion implantation process may be unable to be removed by a thermal annealing process; and the defects may increase the leakage current of the semiconductor device. Thus, although the short channel effect may be prevented by penetrating through an amorphous layer or an oxide layer using the ion implantation process, it may be unable to effectively eliminate the short channel effect; and the source to drain punch may still exist in the semiconductor device. According to the disclosed methods and the device structures, the source to drain punch and the short channel effect may be overcome by forming isolation layers between doping regions.

Figure 9:
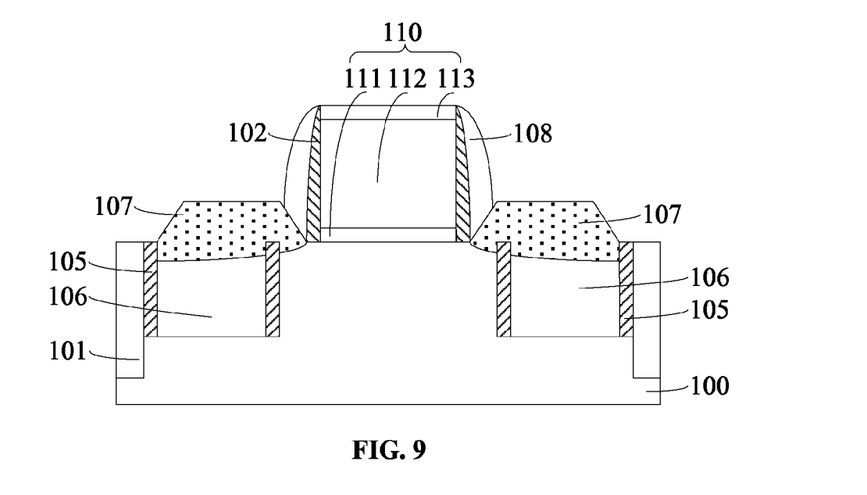
Figure 10:
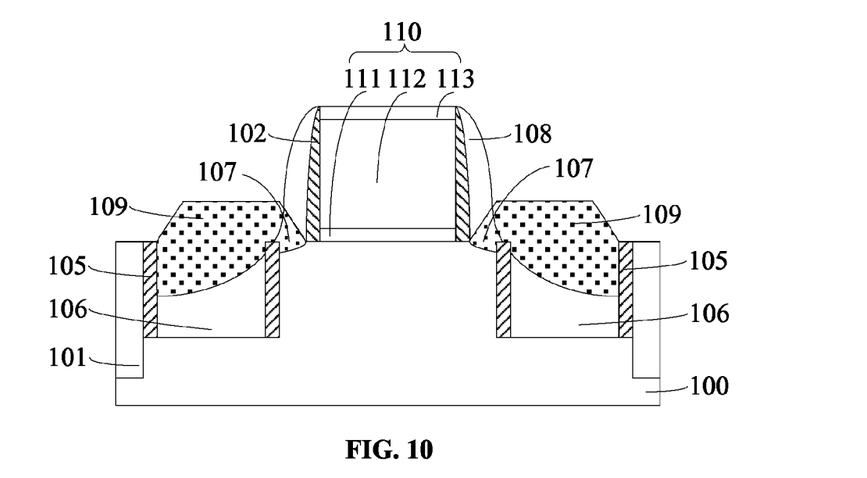
Figure 11:
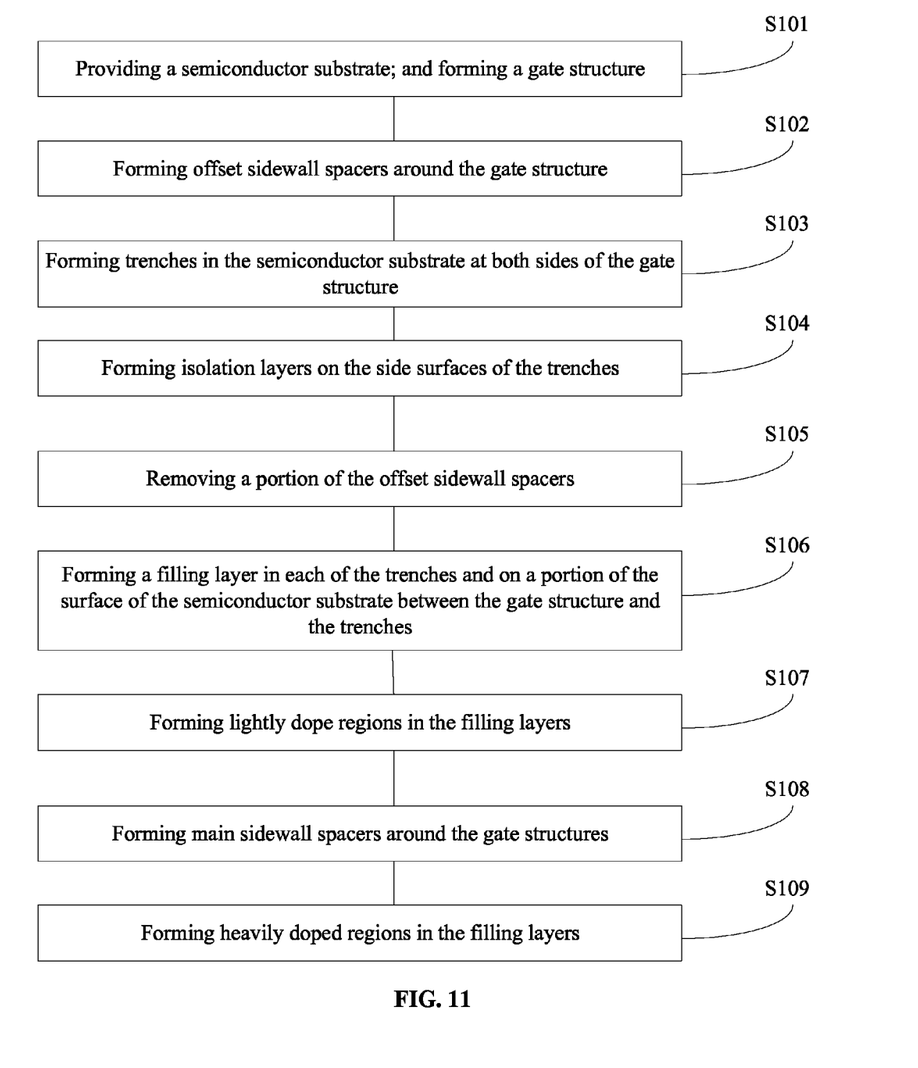
FIG. 11 illustrates an exemplary fabrication process of a semiconductor device consistent with the disclosed embodiments.

FIG. 11 illustrates an exemplary fabrication process of a semiconductor device consistent with disclosed embodiments; and FIGS. 2~10 illustrate semiconductor structures corresponding to certain stages of the exemplary fabrication process.

Figure 2:
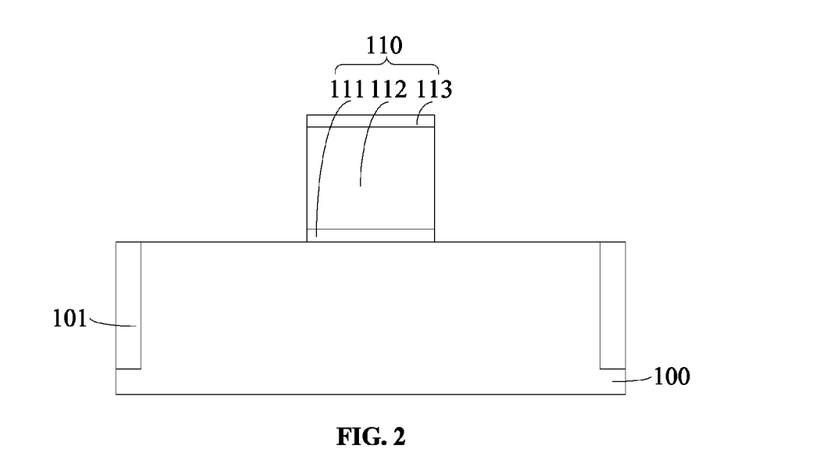
FIGS. 2~10 illustrate semiconductor structures corresponding to certain stages of an exemplary fabrication process of a semiconductor device consistent with the disclosed embodiments.

As shown in FIG. 11, at the beginning of the fabrication process, a semiconductor substrate with certain structures is provided (S101). FIG. 2 illustrates a corresponding semiconductor structure.

As shown in FIG. 2, a semiconductor substrate 100 is provided. Further, a gate structure 110 is formed on a surface of the semiconductor substrate 100.

The semiconductor substrate 100 may include any appropriate semiconductor materials, such as silicon, silicon on insulator (SOI), germanium on insulator (GOI), silicon germanium, carborundum, indium antimonide, lead telluride, indium arsenide, indium phosphide, gallium arsenide, gallium antimonite, or alloy semiconductor, etc. In one embodiment, the semiconductor substrate 100 is made of silicon. The semiconductor substrate 100 provides a base for subsequent processes and structures.

Referring to FIG. 2, the gate structure 110 may include a gate oxide layer 111 formed on the surface of the semiconductor substrate 100 and a gate electrode layer 112 formed on the surface of the gate oxide layer 111.

The gate oxide layer 111 may be made of any appropriate material, such as silicon oxide, silicon oxynitride, or high-K dielectric material, etc. Various processes may be used to form the gate oxide layer 111, such as a chemical vapor deposition (CVD) process, a physical vapor deposition (PVD) process, an atomic layer deposition (ALD) process, a flowable chemical vapor deposition (FCVD) process, a thermal oxidation process, or a sputtering process, etc.

The gate electrode layer 112 may be made of any appropriate material, such as poly silicon, doped poly silicon, or metal material, etc. Various processes may be used to form the gate electrode layer 112, such as a CVD process, a PVD process, an FCVD process, a sputtering process, or an electro plating process, etc.

Further, in one embodiment, the gate structure 110 may also include a top mask layer 113 formed on the surface of the gate electrode layer 112. The top mask layer 113 may be used to prevent a subsequent ion implantation process from implanting doping ions into the gate oxide layer 111 and/or the gate electrode layer 112. If the doping ions are implanted into the gate oxide layer 111 and/or the gate electrode layer 112, the electrical properties of the gate structure 110 may be affected. The top mask layer 113 may also be used as a mask for subsequently forming trenches in the semiconductor substrate 100.

The top mask layer 113 may be made of any appropriate material, such as silicon oxide, silicon nitride, silicon oxynitride, or silicon carbonitride, etc. In one embodiment, the top mask layer 113 is made of silicon nitride.

Various processes may be used to form the top mask layer 113, such as a CVD process, a PVD process, an ALD process, or an FCVD process, etc.

Further, referring to FIG. 2, a plurality of isolation structures 101 may be formed in the semiconductor substrate 100. The isolation structures 101 may be formed between adjacent semiconductor devices; and may be used to prevent electrical connections between the adjacent semiconductor devices.

The isolation structures 101 may be made of any appropriate material, such as silicon oxide, silicon nitride, silicon oxynitride etc. In one embodiment, the isolation structures 101 are shallow trench isolation (STI) structures made of silicon oxide.

Figure 3:
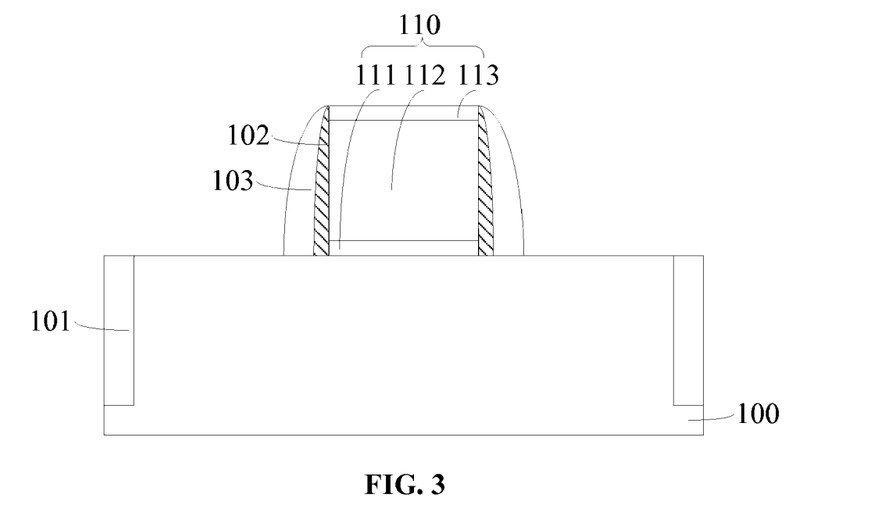

Returning to FIG. 11, after providing the semiconductor substrate 100 and forming the gate structure 110, offset sidewall spacers may be formed (S102). FIG. 3 illustrates a corresponding semiconductor structure.

As shown in FIG. 3, offset sidewall spacers (not labeled) including a first layer 102 and a second layer 103 are formed on both sides of the gate structure 110. In certain other embodiments, the offset sidewall spacers are single layer structures, or multiple-stacked structures including more than two layers.

The offset sidewall spacers may expose the surface of the semiconductor substrate 100 at both sides of the gate structure 110. The offset sidewall spacers may be used as a mask for subsequently etching the semiconductor substrate 100. The offset sidewall spacers may also be used to protect the side surfaces of the gate structure 110. Further, in one embodiment, the offset sidewall spacers may be used as a mask for subsequently forming lightly doped drain regions.

The first layer 102 and the second layer 103 of the offset sidewall spacers may be made of any appropriate material, such as one more of silicon oxide, silicon nitride, silicon oxynitride, or silicon carbonitride, etc. In one embodiment, the first layer 102 is made of silicon oxide; and the second layer is made of silicon nitride. For illustrative purposes, a silicon oxide layer 102 may be used to refer to the first layer 102; and a silicon nitride layer 103 may be used to refer to the second layer 103. After subsequently removing the silicon nitride layer 103, the silicon oxide layer 102 of the offset sidewall spacers may be used as the mask to subsequently form the lightly doped regions.

In certain other embodiments, the offset sidewall spacers are single layer structures made of silicon nitride. In certain other embodiments, the offset sidewall spacers are triple-layer structures. That is, the offset sidewalls pacers have a silicon oxide-silicon nitride-silicon oxide structure.

The offset sidewall spacers may be formed by an etch back process. Specifically, the etch back process for forming the offset sidewall spacers may include forming an offset spacer material layer (not shown) on the surfaces of the gate structure 110, followed by an etch back process. The offset spacer material layer may be one layer, or two layers, etc., which may depend on the final structure of the offset sidewall spacers.

Various processes may be used to form the offset sidewall spacer material layer, such as a CVD process, a PVD process, or an FCVD process, etc. The etch back process may include a dry etching process, a wet etching process, or an ion beam etching process, etc.

Figure 4:
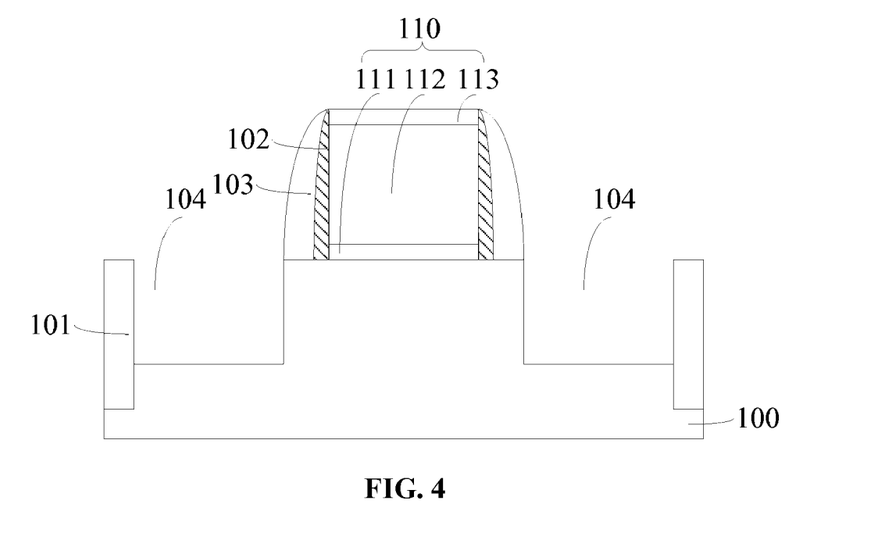

Returning to FIG. 11, after forming the offset sidewall spacers, trenches may be formed in the semiconductor substrate 100 at both sides of the offset sidewall spacers (S103). FIG. 4 illustrates a corresponding semiconductor structure.

As shown in FIG. 4, trenches 104 are formed in the semiconductor substrate 100 at both sides of the silicon nitride layers 103 of the offset spacers. The process for forming the trenches 104 may also be referred as a silicon recess process if the semiconductor substrate 100 is made of silicon.

Various processes may be used to form the trenches 104, such as a dry etching process, a wet etching process, or an ion beam etching process, etc. In one embodiment, the trenches 104 are formed by a dry etching process.

In one embodiment, the etching gas of the dry etching process may include $CF_4$ and He, etc. The flow of $CF_4$ may be in a range of approximately 200 sccm~500 sccm. The flow of He may be in a range of 1000 sccm~2000 sccm. The pressure of the etching chamber may be in a range of approximately 1 Pa~10 Pa. The radio frequency power of the dry etching process may be in a range of approximately 250 W~350 W. The frequency of the radio frequency may be in a range of approximately 0~13.56 MHz.

Figure 5:
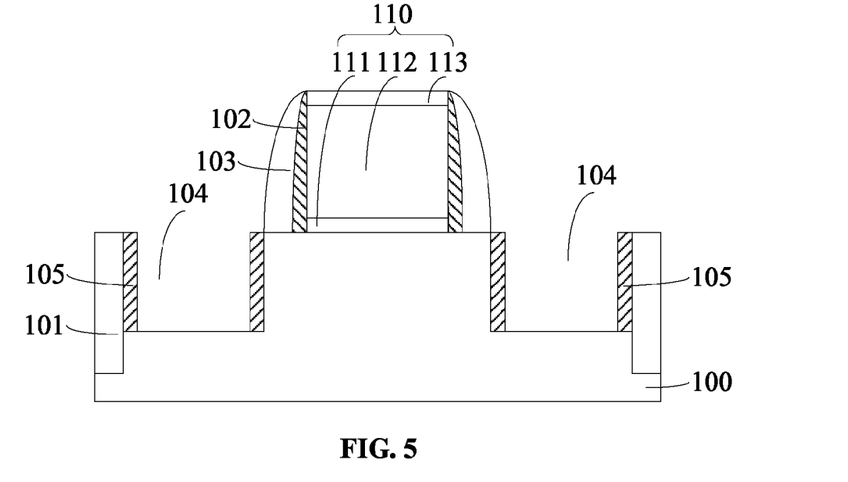

Returning to FIG. 11, after forming the trenches 104, isolation layers 105 may be formed on side surfaces of the trenches 104 (S104), FIG. 5 illustrates a corresponding semiconductor structure.

As shown in FIG. 5, isolation layers 105 are formed on the side surfaces of the trenches 104. The isolation layers 105 near to the gate structure 110 may effectively prevent diffusions between the subsequently doping regions, the short channel effect may be prevented; and the source to drain punch may be avoided.

The isolation layers 105 may be made of any appropriate material, such as one or more of silicon oxide, silicon nitride, or silicon oxynitride, etc. The isolation layers 105 may be single layer structures, or multiple stacked structures. In one embodiment, the isolation layers 105 are single layer structures made of silicon oxide.

In one embodiment, a process for forming the isolation layers 105 may include forming an isolation material layer on the surfaces of the trenches 104, the offset sidewall spacers, and the gate structure 110; and followed by removing the isolation material layer on the surfaces of the gate structure 110 and bottom surfaces of the trenches 104 by an etching process. Thus, isolation layers 105 may be formed on the side surfaces of the trenches 104.

The isolation material layer may be formed by any appropriate process, such as a CVD process, a PVD process, an ALD process, or an FCVD process, etc.

Various processes may be used to etch the isolation material layer, such as a dry etching process, a wet etching process, or an ion beam etching process. In one embodiment, an anisotropic dry etching process is used to etch the isolation material layer to form isolation layers 105.

The anisotropic dry etching process may be a plasma dry etching process. The source power of the plasma dry etching process may be in a range of approximately 500 W~1500 W or approximately 500 W~1000 W. The bias power of the plasma dry etching process may be in a range of approximately 1000 W~2500 W. The pressure of the reaction chamber may be in a range of approximately 10 mTorr~100 mTorr. The etching gas may include $C_4F_8$ or $C_4F_6$, etc. The etching gas may also include $N_2$, $O_2$, $CO_2$, or Ar, etc.

Figure 6:
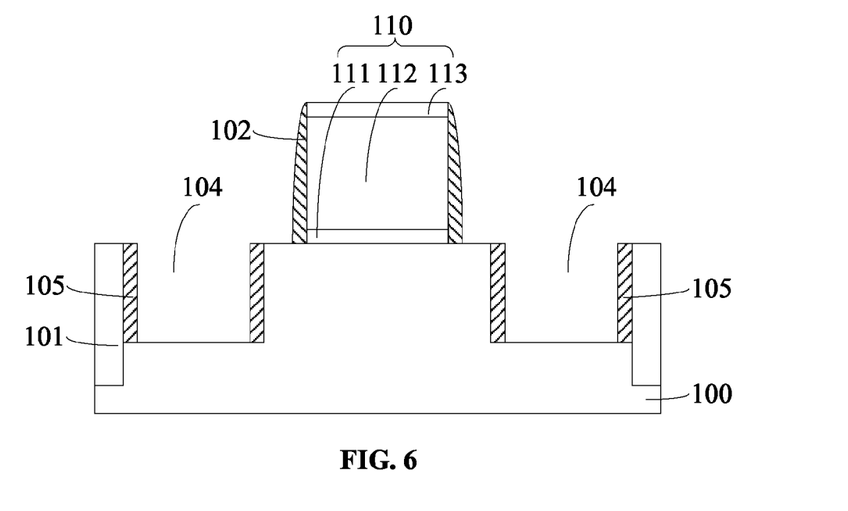

Returning to FIG. 11, after forming the isolation layers 105, a portion of the offset sidewall spacer may be removed (S105). FIG. 6 illustrates a corresponding semiconductor structure.

As shown in FIG. 6, a portion of the offset sidewall spacer is removed. Portions of the surface of the semiconductor substrate 100 between the trenches 104 and the gate structure 110 may be exposed.

In one embodiment, the silicon nitride layers 103 of the offset sidewall spacers are removed; and portions of the surface of the semiconductor substrate 100 between the isolation layers 105 and the silicon oxide layers 102 of the offset sidewall spacers are exposed. Subsequently formed filling layers may connect with the exposed portion of the surface of the semiconductor substrate 100 between the isolation layers 105 and the silicon oxide layers 102. That is, the subsequently formed filling layers may connect with the semiconductor substrate 100 under the gate structure 110. After subsequently forming doping regions in the filling layers, the doping regions may electrically connect with the channel region the semiconductor device under the gate structure 110; and may be configures as source/drain regions.

Various processes may be used to remove the silicon nitride layers 103, such as a dry etching process, a wet etching process, or an ion beam etching process, etc. In one embodiment, the silicon nitride layers 103 are removed by a wet etching process.

The etching solution of the wet etching process may include any appropriate chemicals. In one embodiment, the etching solution is a hot phosphoric acid solution. The temperature of the hot phosphoric acid solution may be in a range of approximately 70° C.~200° C. The mass percentage of phosphoric acid may be in a range of approximately 70%~85%.

After removing the silicon nitride layers 103 of the offset sidewall spacers, the silicon oxide layers 102 of the offset sidewall spacers may be used as a mask layer for subsequently forming lightly doped regions, thus the fabrication process may be simplified. Further, the silicon oxide layers 102 may also be used to prevent a filling material layer subsequently formed in the trenches 104 from being formed on the surfaces of the gate structure 110.

In certain other embodiments, the silicon nitride layers 103 may be removed before forming the isolation layers 105.

Figure 7:
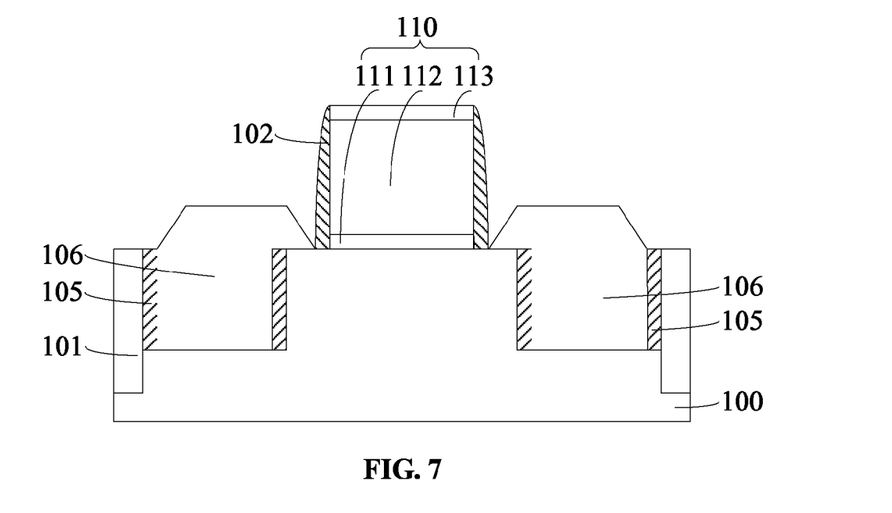

Returning to FIG. 11, after forming the isolation layers 105, a filling layer may be formed in each of the trenches 104 (S106). FIG. 7 illustrates a corresponding semiconductor structure.

As shown in FIG. 7, a filling layer 106 is formed in each of the trenches 104. The filling layers 106 may cover portions of the surface of the semiconductor substrate 100 exposed by the silicon oxide layers 102. Further, the top surface of the filling layer 106 may be higher than the surface of the semiconductor substrate 100. The filling layers 106 may be configured as source/drain regions of the semiconductor device, thus the source/drain regions may be referred as raised source/drain regions.

The filling layers 106 may be made of any appropriate material, such as Si, SiGe, SiGeB, SiC, or SiCP, etc.

In one embodiment, the semiconductor device may be an NMOS transistor. The filling layers 106 may be made of Si, SiGe, or SiGeB. When the filling layers 106 are made of SiGe or SiGeB, the filling layers 106 may provide a tensile stress to the channel region of the semiconductor device, thus the carrier mobility of the semiconductor device may increased; and the speed of the semiconductor device may be increased.

In certain other embodiments, the semiconductor device may be a PMOS transistor. The filling layers 106 may be made of Si, SiC, or SiCP. When the filling layers 106 are made of SiC or SiCP, the filling layers 106 may provide a compressive stress to the channel region of the semiconductor device, thus the carrier mobility of the semiconductor device may be increased; and the speed of the semiconductor device may be increased.

Various processes may be used to form the filling layers 106, such as a CVD process, a PVD process, an ALD process, an FCVD process, or an epitaxial growth process, etc. In one embodiment, the filling layers 106 are formed by a selective epitaxial growth process.

In one embodiment, the filling layers 106 are made of Si. The source gas of the selective epitaxial growth process may include a silicon source gas, $H_2$ and HCl, etc. The silicon source gas may be $SiH_4$ or $SiH_2Cl_2$, etc. The flow of the silicon source gas may be in a range of approximately 1 sccm~1000 sccm. The flow of HCl may be in a range of approximately 1 sccm~1000 sccm. The flow of $H_2$ may be in a range of approximately 100 sccm~10000 sccm.

The temperature of the reaction chamber of the selective epitaxial growth process may be in a range of approximately 700 sccm~800 sccm. The pressure of the reaction chamber may be in a range of approximately 1 Torr~100 Torr.

The selective epitaxial growth process may have the characteristic that material may only be formed on certain types of substrates. For example, the material for the filling layers 106 may only be formed on the surface of a single crystal substrate. In one embodiment, the filling layers 106 formed by the selective epitaxial growth process may only be selectively formed on the bottom surfaces of the trenches 104. Further, the filling layers 106 formed by the selectively epitaxial growth process may also be selectively formed on the surface of the semiconductor substrate 100 between the isolation layers 105 and the gate structure 110. Referring to FIG. 7, after the filling layer 106 is formed in the trench 104, the width of the portion of the filling layer 106 higher than the surface of the semiconductor substrate 106 may be gradually decreasing.

In one embodiment, the silicon oxide layers 102 are formed around the gate structure 110, when the filling layer 106 is formed in the trench 104 by the selective epitaxial growth process, the material of the filling layer 106 may unlikely be formed on the surface of the gate structure 110. Thus, the reliability of the semiconductor device may be improved.

Figure 8:
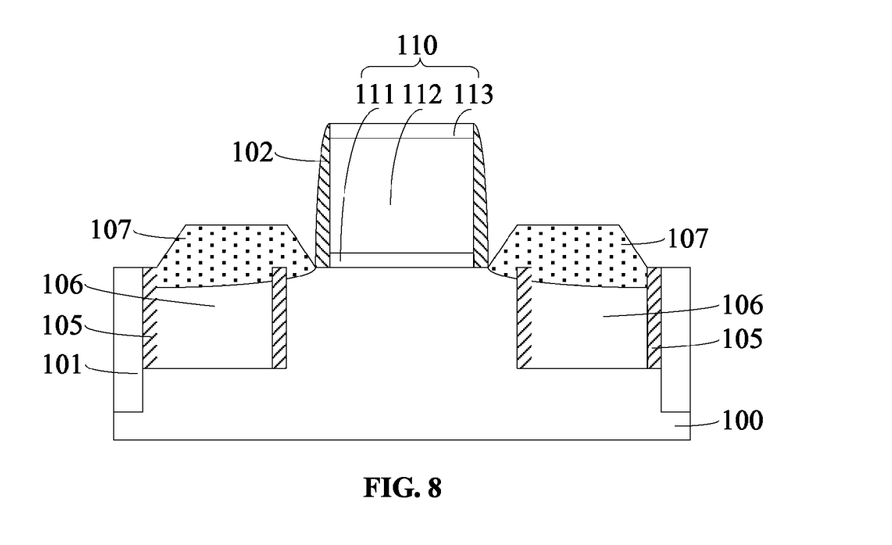

Returning to FIG. 11, after forming the filling layers 106, lightly doped regions may be formed (S107). FIG. 8 illustrates a corresponding semiconductor structure.

As shown in FIG. 8, a lightly doped region 107 is formed in each of the filling layers 106. In one embodiment, the lightly doped regions 107 may be formed by an ion implantation process using the silicon oxide layers 102 as a mask. The depth of the ion implantation process may be smaller than the distance between the top surface of the filling layer 106 and the top surface of the isolation layer 105. Because the top surface of the filling layer 106 may be higher than the surface of the semiconductor substrate 100; and the filling layers 106 may be subsequently configured as source/drain regions of the semiconductor device, the process for forming the lightly doped regions may be referred as a source/drain extension implantation process.

Further, referring to FIG. 8, the lightly doped regions 107 may also be formed in the semiconductor substrate 100 at both sides of the gate structure 110. The lightly doped regions 107 may be used to reduce the thermal carrier effect of the semiconductor device.

In one embodiment, if the semiconductor device is a PMOS transistor, the ions of the ion implantation process may be P-type ions. The P-type ions may be boron ions or indium ions, etc. The energy of the ion implantation process may be in a range of approximately 1 keV~10 keV. The dose of the ion implantation process may be in a range of approximately $1E14$ atom/$cm^2$~$1E15$ atom/$cm^2$.

In certain other embodiments, if the semiconductor device is an NMOS transistor, the ions of the ion implantation process may be N-type ions. The N-type ions may be phosphorous ions or arsenic ions, etc. The energy of the ion implantation process may be in a range of approximately 1 keV~10 keV. The dose of the ion implantation process may be in a range of approximately $1E13$ atom/$cm^2$~$1E16$ atom/$cm^2$.

Further, after forming the lightly doped regions 107, a thermal annealing process may be performed. The thermal annealing process may repair the crystal lattice damages of the semiconductor substrate 100 caused by the ion implantation process. The thermal annealing process may also cause the implanted ions to redistribute in the filling layers 106.

Returning to FIG. 11, after forming the lightly doped regions 107, main sidewall spacers may be formed (S108). FIG. 9 illustrates a corresponding semiconductor structure.

As shown in FIG. 9, main sidewall spacers 108 are formed on both sides of the gate structure 110. In one embodiment, the silicon oxide layers 102 are formed on both sides of the gate structure 110, thus the main sidewall spacers 108 are formed on the side surfaces of the silicon oxide layers 102. The main sidewall spacers 108 may be used as a mask for subsequently forming heavily doped regions.

The main sidewall spacers 108 may be made of any appropriate material, such as silicon oxide, silicon nitride, or silicon oxynitride, etc. The main sidewall spacers 108 may be single layer structures, or multiple stacked structures, etc.

A process for forming the main sidewall spacers 108 may include forming a main sidewall spacer material layer to cover the gate structure 110, the oxide layers 102, the filling layers 106 and the isolation structures 101; and followed by removing portions the main sidewall spacer material layer on the top surface of the gate structure 110, the top surfaces of the filling layers 106 and the top surfaces of the isolation structures 101. Thus, the main sidewall spacers 108 may be formed on the side surfaces of the oxide layers 102.

The main sidewall spacer material layer may be formed by any appropriate process, such as a CVD process, a PVD process, or an FCVD process, etc. In one embodiment, the main sidewall spacer material layer is formed by a CVD process. The main sidewall spacer material layer on the top surface of the gate structure 110, the top surfaces of the filling layers 106 and the top surfaces of the isolation structures 101 may be removed by any appropriate process, such as a dry etching process, a wet etching process, or an ion beam etching process, etc.

Returning to FIG. 11, after forming the main sidewall spacers 108, heavily doped regions may be formed in the filling layers 106 (S109). FIG. 10 illustrates a corresponding semiconductor structure.

As shown in FIG. 10, a heavily doped region 109 is formed in each of the filling layers 106 at both sides of the main sidewall spacers 108. The heavily doped regions 109 may be formed by doping the filling layers 106. Because the heavily doped regions 109 may be configured as source/drain regions of the semiconductor device, the process for forming the heavily doped regions 109 may be referred as a source/drain implantation process.

Various processes may be used to dope the filling layers 106 to form the heavily doped regions 109, such as an ion implantation process, or a thermal diffusion process, etc. In one embodiment, the filling layers 106 are doped by an ion implantation process to form the heavily doped regions 109.

In one embodiment, when the semiconductor device is a PMOS transistor, the implanted ions are P-type ions. The P-type ions may be boron ions, or indium ions, etc. The energy of the ion implantation process may be in a range of approximately 1 keV~50 keV. The dose of the ion implantation process may be in a range of approximately $1E15$ atom/$cm^2$~$5E19$ atom/$cm^2$.

In certain other embodiments, when the semiconductor device is an NMOS transistor, the implanted ions are N-type ions. The N-type ions may be phosphorous ions, or arsenic ions, etc. The energy of the ion implantation process may be in a range of approximately 1 keV~100 keV. The dose of the ion implantation process may be in a range of approximately $1E14$ atom/$cm^2$~$5E18$ atom/$cm^2$.

After forming the heavily doped regions 109, a thermal annealing process may be performed. The thermal annealing process may be used to repair the crystal lattice damages caused by the ion implantation process.

Further, metal silicide layers may be formed on the surfaces of the filling layers 106 in the heavily doped regions 109. The metal silicide layers may be used to reduce the contact resistance of the filling layers 106 with other devices and interconnection structures, etc. After forming the metal silicide layers, contacts may be formed to connect the semiconductor device with other devices and interconnection structures, etc.

In one embodiment, referring to FIG. 10, the lightly doped regions 107 and the heavily doped regions 109 may together to be referred as doping regions.

In certain other embodiments, besides the lightly doped regions 107 and the heavily doped regions 109, the doping regions may also include pocket regions (not shown). The doping type of the pocket regions may be opposite to the doping type of the lightly doped regions 107. The pocket regions may also reduce the short channel effect to a certain extend.

Referring to FIG. 10, because the top surface of the filling layers 106 (heavily doped regions 109) may be higher than the surface of the semiconductor substrate 100, and the doping regions may be configured as the source/drain regions of the semiconductor devices, the source/drain regions may be referred as raised source/drain regions.

Referring to FIG. 10, the channel region in the semiconductor substrate 100 and the heavily doped regions 109 may be isolated by the isolation layers 105. The isolation layers 105 may block the diffusions between the heavily doped regions 109, thus the source drain punch may be prevented; and the reliability of the semiconductor device may be improved. Further, the surfaces of the heavily doped regions 109 may be higher than the surface of the semiconductor substrate 100, thus the semiconductor device may have raised source/drain regions. The raised source/drain regions may reduce the resistance between the source region and the drain region, thus the short channel effect of the semiconductor device may be improved.

By using the disclosed methods and device structures, diffusions between doping regions may be avoided, thus the source to drain punch of the semiconductor device may be prevented; and the breakdown voltage of the semiconductor device may be increased. Therefore, the requirements for the device miniaturization may be matched; and the electrical properties of the semiconductor devices may be optimized. Further, stress may be generated to the channel region of the semiconductor device, the carrier mobility of the semiconductor device may be increased, thus the speed of the semiconductor device may be increased; and the electrical properties of the semiconductor device may be optimized. Further, some fabrication steps of the semiconductor device may be omitted, thus the production efficiency may be improved.

Thus, a semiconductor device may be formed by the above disclosed processes and methods; and a corresponding semiconductor device is illustrated in FIG. 10. The semiconductor device includes a semiconductor substrate 100, and a gate structure 110 having a gate oxide layer 111 formed on the semiconductor substrate 100, a gate electrode layer 112 formed on the surface of the gate oxide layer 111 and a top mask layer 113 formed on the gate electrode layer 112. The semiconductor device also includes silicon oxide layers 108 formed around the gate structure 110 and main sidewall spacers formed on the silicon oxide layers 108. Further, the semiconductor device includes filling layers 106 with a surface higher than the surface of the semiconductor substrate 100 formed in the semiconductor substrate 100 and on portions of the surface of the semiconductor substrate 100 between the side surfaces of the filling layers 106 and the semiconductor substrate 100 to prevent diffusions between doping regions. Further, the semiconductor device also includes doping regions including lightly doped regions 109 and heavily doped regions 107 configured as raised source/drain regions formed in the filling layers 106 and shallow trench isolation structures 101 formed in the semiconductor substrate 100.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor device, comprising:
    providing a semiconductor substrate having a first surface coplanar with an adjacent isolation structure formed in the semiconductor substrate;
    forming a gate structure on the semiconductor substrate;
    forming offset sidewall spacers covering side surfaces of the gate structure and exposing portions of the first surface of the semiconductor substrate;
    forming trenches in the semiconductor substrate adjacent to the gate structure by etching the semiconductor substrate using the offset sidewall spacers as an etching mask;
    forming isolation layers on side surfaces of the trenches to prevent diffusions between subsequently formed doping regions;
    before forming filling layers, removing at least portions of the offset sidewall spacers to expose portions of the first surface of the semiconductor substrate between remaining portions of the offset sidewall spacers of the gate structure and the trenches;
    forming the filling layers with a top surface higher than the first surface of the semiconductor substrate by filling the trenches and covering portions of the first surface of the semiconductor substrate between the remaining portions of the offset sidewall spacers of the gate structure and the trenches; and
    forming doping regions in the filling layers to form raised source/drain regions.

2. The method according to claim 1, after forming the doping regions, further including:
    forming metal silicide layers on the top surface of the filling layers; and
    forming contacts on the metal silicide layers.

3. The method according to claim 1, wherein:
    the isolations layers are made of silicon oxide, silicon nitride, or silicon oxynitride.

4. The method according to claim 1, wherein forming the isolation layers further includes:
    forming an isolation material layer to cover the trenches, the offset sidewall spacers and the gate structure; and
    removing portions of the isolation material layer on surfaces of the offset sidewall spacers and the gate structure and bottom surfaces of the trenches by an etching process.

5. The method according to claim 4, wherein:
    the etching process is an anisotropic dry etching process.

6. The method according to claim 5, wherein:
    the dry etching process is a plasma etching process;
    a source power of the plasma etching process is in a range of approximately 500 W~1500 W;
    a bias power of the plasma etching process is in a range of approximately 1000 W~1500 W;
    a pressure of the reaction chamber of the plasma etching process is in a range of approximately 10 mTorr~100 mTorr;
    an etching gas of the plasma etching process includes $C_4F_8$ or $C_4F_6$; and
    the etching gas also includes $N_2$, $O_2$, $CO_2$, or Ar.

7. The method according to claim 1, wherein:
    the offset sidewall spacers are multiple-stacked structures comprising a silicon oxide layer and a silicon nitride layer.

8. The method according to claim 7, wherein removing the at least portions of the offset sidewall spacers further includes:
    removing the silicon nitride layer.

9. The method according to claim 1, wherein:
    the filling layers are formed by a selective epitaxial growth process.

10. The method according to claim 9, wherein:
    the filling layers are made of Si, SiGe, SiGeB, SiC, or SiCP.

11. The method according to claim 9, wherein:
    the filling layers are made of Si;
    the reaction gas of the selective epitaxial growth process includes a silicon source gas, $H_2$, and HCl;
    the silicon source gas includes $SiH_4$ or $SiH_2Cl_2$;
    a flow of the silicon source gas is in a range of approximately 1 sccm~1000 sccm;
    a flow of HCl is in a range of approximately 1 sccm~1000 sccm;
    a flow of $H_2$ is in range of approximately 100 sccm~1000 sccm;
    a temperature of a reaction chamber of the selective epitaxial growth process is in a range of approximately 700° C.~800° C.; and
    a pressure of the reaction chamber is in a range of approximately 1 Torr~100 Torr.

12. The method according to claim 1, wherein:
    the doping regions include lightly doped regions and heavily doped regions.

13. The method according to claim 12, wherein the heavily doped regions are formed by:
    forming main sidewall spacers covering side surfaces of the remaining portions of the offset sidewall spacers of the gate structure and on a surface portion of the lightly doped regions in the filling layers; and
    doping the filling layers at both sides of the gate structure using the main sidewall spacers as a mask to form the heavily doped regions in the filling layers.

14. The method according to claim 13, after forming the lightly doped regions or the heavily doped regions, further including:
    performing a thermal annealing process.

15. The method according to claim 1, wherein:
    the filling layers with the top surface higher than the first surface cover entire exposed portions of the first surface of the semiconductor substrate between the trenches and the gate structure.

16. The method according to claim 1, wherein:
    immediately forming the doping regions in the filling layers, after forming the filling layers with the top surface higher than the first surface.

17. The method according to claim 1, wherein:
the isolation layers have a uniform thickness along the side surfaces of the trenches, and portions of the isolation layers are removed from a bottom of the trenches.

18. The method according to claim 17, wherein:
after forming the isolation layers having the uniform thickness and before forming the filling layers, removing at least the portions of the offset sidewall spacers to expose portions of the first surface of the semiconductor substrate between the gate structure and the trenches.

* * * * *